(12) United States Patent
Kobayashi et al.

(10) Patent No.: US 8,379,431 B2
(45) Date of Patent: Feb. 19, 2013

(54) SEMICONDUCTOR MEMORY DEVICE AND WRITING METHOD THEREOF

(75) Inventors: Shigeki Kobayashi, Kuwana (JP); Kazuhiko Yamamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 161 days.

(21) Appl. No.: 13/043,923

(22) Filed: Mar. 9, 2011

(65) Prior Publication Data

US 2011/0235395 A1 Sep. 29, 2011

(30) Foreign Application Priority Data

Mar. 24, 2010 (JP) ................................. 2010-068076

(51) Int. Cl.
*G11C 11/00* (2006.01)
(52) U.S. Cl. .......................................... 365/148; 365/63
(58) Field of Classification Search .................. 365/148, 365/63

See application file for complete search history.

(56) References Cited

U.S. PATENT DOCUMENTS

| | | | | |
|---|---|---|---|---|
| 7,345,908 B2* | 3/2008 | Hachino et al. | ............... | 365/148 |
| 2007/0159867 A1* | 7/2007 | Muraoka et al. | ............... | 365/100 |
| 2010/0181546 A1 | 7/2010 | Yamamoto et al. | | |
| 2010/0213433 A1 | 8/2010 | Yamamoto et al. | | |
| 2010/0214818 A1* | 8/2010 | Kitagawa et al. | ............. | 365/148 |
| 2010/0237319 A1 | 9/2010 | Satoh et al. | | |
| 2010/0265757 A1* | 10/2010 | Otsuka | ........................ | 365/148 |
| 2011/0049463 A1 | 3/2011 | Yamamoto et al. | | |

FOREIGN PATENT DOCUMENTS

| | | |
|---|---|---|
| JP | 2004-192789 | 7/2004 |
| JP | 2006-191033 | 7/2006 |
| JP | 2006-245280 | 9/2006 |
| JP | 2008-205191 | 9/2008 |
| JP | 2008-251059 | 10/2008 |

* cited by examiner

*Primary Examiner* — Tuan T. Nguyen
(74) *Attorney, Agent, or Firm* — Oblon, Spivak, McClelland, Maier & Neustadt, L.L.P.

(57) ABSTRACT

A memory cell array includes memory transistors each including a gate insulating film formed on a semiconductor substrate, a gate electrode formed on the gate insulating film, and a variable resistance film formed on the gate electrode and made of a variable resistance material having variable resistance and is configured by plural memory strings disposed with longer direction extending in a first direction and including plural series-connected memory transistors. Word lines are disposed with a longer direction extending in a second direction orthogonal to the first direction, and connected commonly to the gate electrodes of the plural memory transistors lined up in the second direction. A plate line is disposed to sandwich the variable resistance film with the gate electrode. First voltage terminals supply a certain voltage to first ends of the plural memory strings. Second voltage terminals supply a certain voltage to second ends of the plural memory strings.

20 Claims, 3 Drawing Sheets

FIG. 4
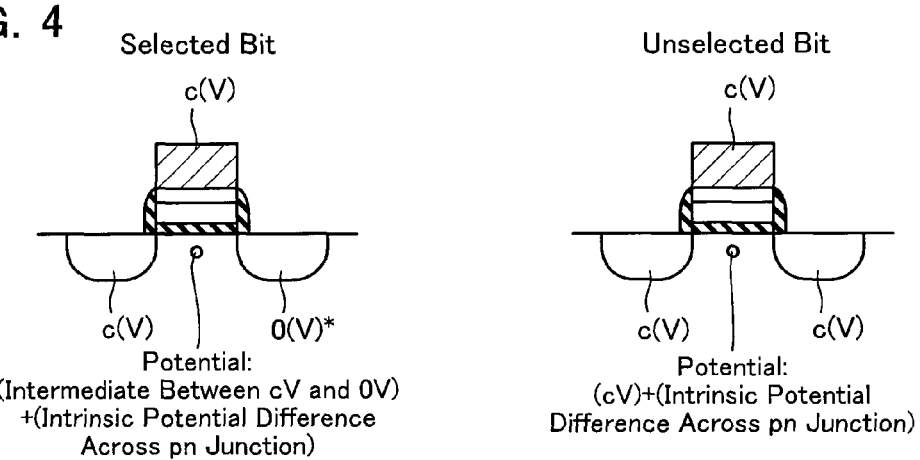
FIG. 5 Reset Operation
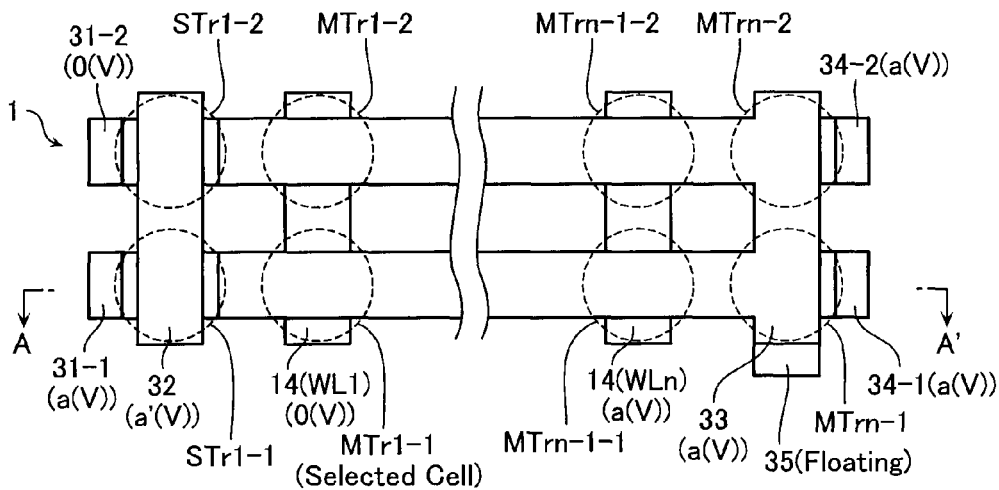
FIG. 6 Read Operation
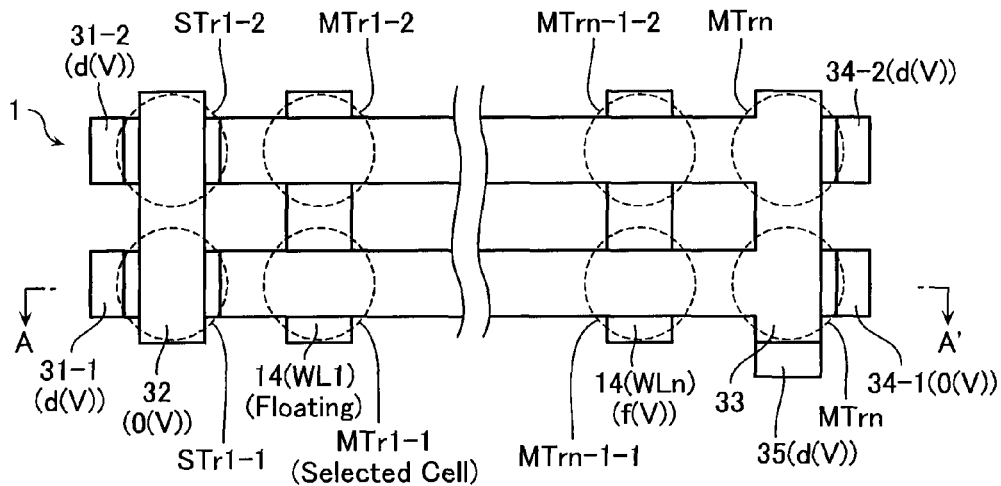

SEMICONDUCTOR MEMORY DEVICE AND WRITING METHOD THEREOF

CROSS REFERENCE TO RELATED APPLICATIONS

This application is based on and claims the benefit of priority from prior Japanese Patent Application No. 2010-68076, filed on Mar. 24, 2010, the entire contents of which are incorporated herein by reference.

BACKGROUND

1. Field

Embodiments described herein relate generally to a semiconductor memory device and a writing method thereof.

2. Description of the Related Art

There is a rapid increase in demand for NAND type flash memory along with increase of applications of mobile devices that process large-size data such as images, motion pictures, etc. Especially, by employing a multi-value storage technique that enables information of two bits or more to be stored in one memory cell, NAND type flash memory has become able to store more information with a smaller chip area. NAND type flash memory uses, for example, a floating-gate type memory cell and stores data in the memory cell by storing charges in the floating gate and thereby changing the threshold voltage of the memory cell.

However, along with the progress of miniaturization, it is becoming difficult to maintain data reliability by using this data storing scheme based on storing of charges in the floating gate. That is, in a highly-integrated flash memory with a high degree of miniaturization of cells, threshold voltage distributions fluctuate due to interference between adjoining cells, raising a problem that data reliability is damaged. Although various techniques have been proposed to prevent fluctuation of threshold voltage distributions, a fundamental solution has not been achieved yet. Hence, there is a demand for memory cells that do not let the stored data fluctuate due to influence from adjoining memory cells, even when miniaturization progresses.

BRIEF DESCRIPTION OF THE DRAWINGS

FIG. 4 is a conceptual diagram showing a set operation of the semiconductor memory device according to the first embodiment.

FIG. 5 is a conceptual diagram showing a reset operation of the semiconductor memory device according to the first embodiment.

FIG. 6 is a conceptual diagram showing a read operation of the semiconductor memory device according to the first embodiment.

DETAILED DESCRIPTION

Figure 1:
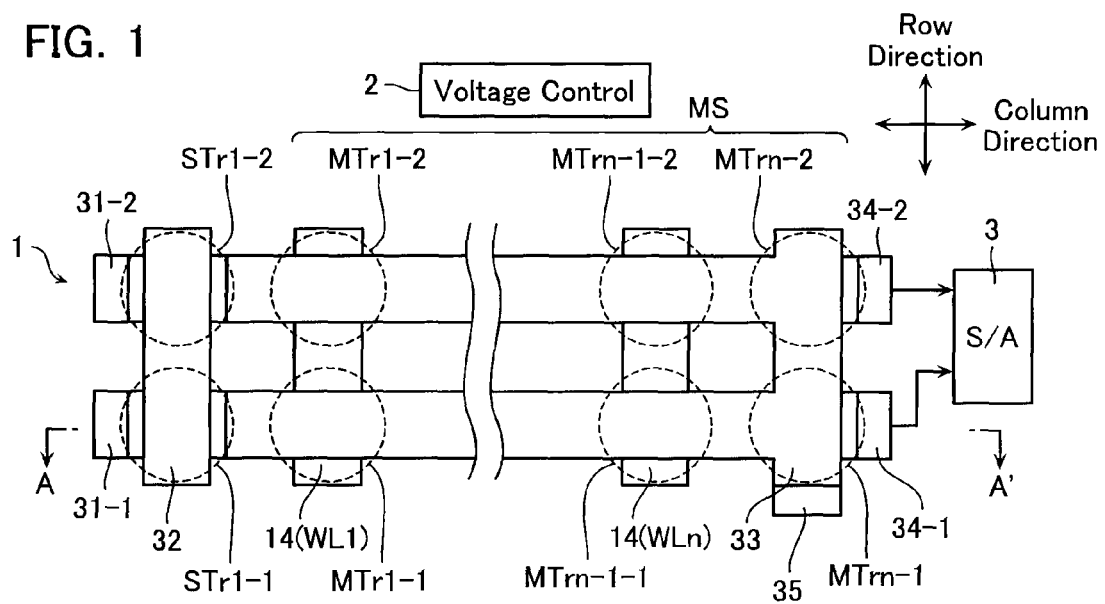
FIG. 1 is a plan diagram showing a configuration of a semiconductor memory device according to a first embodiment.

A semiconductor memory device according to one aspect includes a memory cell array, word lines, a plate line, a plurality of first voltage terminals, and a plurality of second voltage terminals. The memory cell array includes memory transistors. Each memory transistor includes a gate insulating film, a gate electrode, and a variable resistance film. The gate insulating film is formed on a semiconductor substrate. The gate electrode is formed on the gate insulating film. The variable resistance film is formed on the gate electrode and made of a variable resistance material having a variable resistance value. The memory cell array is configured by a plurality of memory strings disposed with their longer direction extending in a first direction and each including plural ones of the memory transistors connected in series. The word lines are disposed with their longer direction extending in a second direction orthogonal to the first direction, and each connected commonly to the gate electrodes of plural ones of the memory transistors lined up in the second direction. The plate line is disposed to sandwich the variable resistance film between itself and the gate electrode. The first voltage terminals are configured to supply a certain voltage to first ends of the plurality of memory strings, respectively. The second voltage terminals are configured to supply a certain voltage to second ends of the plurality of memory strings, respectively.

In a writing method of a semiconductor memory device according to one aspect, the semiconductor memory device includes a memory cell array, word lines, a plate line, a plurality of first voltage terminals, and a plurality of second voltage terminals. The memory cell array includes memory transistors. Each memory transistor includes a gate insulating film, a gate electrode, and a variable resistance film. The gate insulating film is formed on a semiconductor substrate. The gate electrode is formed on the gate insulating film. The variable resistance film is formed on the gate electrode and made of a variable resistance material having a variable resistance value. The memory cell array is configured by a plurality of memory strings disposed with their longer direction extending in a first direction and each including plural ones of the memory transistors connected in series. The word lines are disposed with their longer direction extending in a second direction orthogonal to the first direction, and each connected commonly to the gate electrodes of plural ones of the memory transistors lined up in the second direction. The plate line is disposed to sandwich the variable resistance film between itself and the gate electrode. The first voltage terminals are configured to supply a certain voltage to first ends of the plurality of memory strings, respectively. The second voltage terminals are configured to supply a certain voltage to second ends of the plurality of memory strings, respectively. The writing method of the semiconductor memory device includes setting the word line connected to the memory cell to be written to a floating state, while supplying the remaining word lines with a first voltage. The potential difference between the first voltage and a second voltage supplied to the plate line is smaller than a voltage to be applied to the variable resistance film for changing the resistance value of the variable resistance film.

Next, the embodiments will be explained in detail with reference to the drawings.

[First Embodiment]

Figure 2:
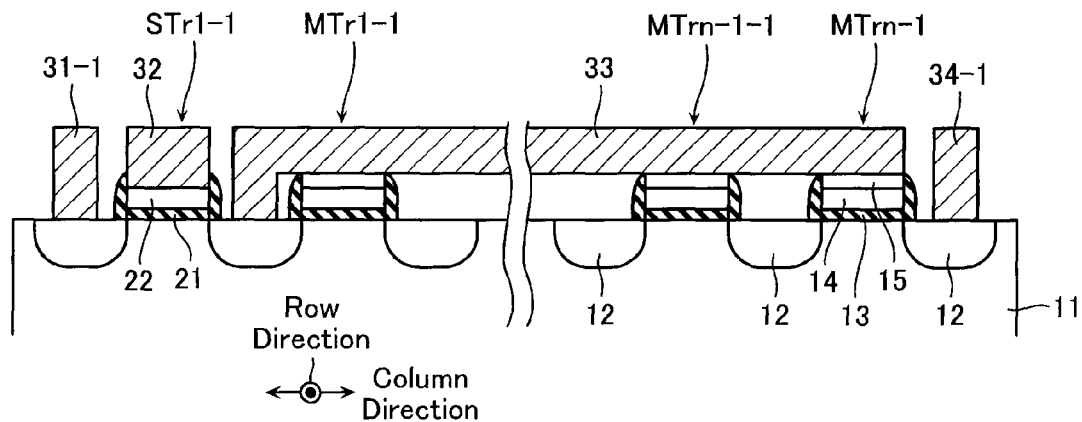
FIG. 2 is a sectional diagram of FIG. 1 taken along a line A-A'.

FIG. 1 is a plan diagram showing the configuration of a semiconductor memory device according to a first embodiment. FIG. 2 is a sectional diagram of FIG. 1 taken along a line A-A'. As shown in FIG. 1, the semiconductor memory device includes a memory cell array 1, a voltage control circuit 2, and a sense amplifier circuit 3.

The memory cell array 1 is configured by a plurality of memory cells MTr each having a field effect transistor (MOSFET) structure. In the memory cell array 1, a plurality of memory cells MTr (memory transistors) are connected in series in a column direction shown in FIG. 1, thus configuring a memory string MS. That is, n memory cells MTr1-$i$ to MTrn-$i$ arranged in line in the column direction are connected in series such that they share source/drain diffusion layers 12 formed in a semiconductor substrate (silicon substrate) 11 as shown in FIG. 2. The source/drain diffusion layers 12 are formed by doping the impurities such as As, P, and B into the semiconductor substrate 11. It is required that the source/drain diffusion layers 12 act as the electrodes, and it is preferable that the source/drain diffusion layers 12 have low resistance. Thus, the silicidation of the source/drain diffusion layers 12 and/or use of metal, instead of doping impurities into the substrate, are examples of the application of the present embodiment.

In the memory cell array 1, a plurality of memory strings MS are disposed to adjoin each other in a row direction orthogonal to the column direction. Though FIG. 1 shows only two memory strings MS for simplifying explanation, needless to say, the present invention is not limited to such a configuration.

Each memory cell MTr includes a gate electrode 14 and a variable resistance film 15. The gate electrode 14 and the variable resistance film 15 are stacked in this order on a portion of the semiconductor substrate 11 between the source/drain diffusion layers 12, via a gate insulating film 13. The gate insulating film 13 is made of, for example, a silicon oxide film ($SiO_2$). The gate electrode 14 is made of, for example, n-type poly-crystalline silicon formed by doping impurities. The variable resistance film 15 can be made of, for example, carbon (C) or a metal oxide film such as titanium oxide. When a certain pulse voltage is applied to the variable resistance film 15, the resistance value of the variable resistance film 15 changes. This resistance change effects data write (set operation) or erase (reset operation). A pulse voltage to be applied to the variable resistance film 15 for executing a set operation is called a set voltage, and a pulse voltage to be applied to the variable resistance film 15 for executing a reset operation is called a reset voltage. The gate electrode 14 is formed with its longer direction extending in a direction perpendicular to the sheet of FIG. 2 (row direction), thus configuring a word line WL.

In the above-mentioned memory cell MTr, when a certain voltage is applied to the gate electrode 14, a conductive channel is formed between adjacent source/drain diffusion layers 12. That is, the memory transistor MTr becomes conductive. In this case, if a potential difference exists between the adjacent source/drain diffusion layers 12, a current flows between the adjacent source/drain diffusion layers 12 through the conductive channel.

On the other hand, when a voltage smaller than the certain voltage is applied to the gate electrode 14, the conductive channel is not formed between the adjacent source/drain diffusion layers 12. That is, the memory transistor MTr is kept in a nonconductive state. In this case, a current does not flow between the adjacent source/drain diffusion layers 12.

A select transistor STr1-$i$ is connected to one end of each memory string MS. Though having a MOSFET structure too, the select transistor STr1-$i$ includes no variable resistance film 15 but only a gate insulating film 21 and a gate electrode 22 unlike the memory cell MTr. The gate electrode 22 is made of, for example, n-type poly-crystalline silicon. A select gate line 32, which is a metal wire made of, for example, tungsten or the like, is formed on the gate electrode 22.

The drain of the select transistor STr1-$i$ is connected to a first voltage terminal 31-$i$. Various voltages are applied to the first voltage terminal 31-$i$ from the voltage control circuit 2 in accordance with the types of operations to be executed and the positions of memory cells MTr to be selected.

The source of the select transistor STr1-$i$ is connected to one end (memory cell MTr1-$i$) of the memory string MS and also to a plate line 33. The plate line 33 is provided to contact the top surface of the variable resistance film 15, such that the variable resistance film 15 is sandwiched between the plate line 33 and the gate electrode 14. The plate line 33 is connected to a third voltage terminal 35 configured to control the voltage of the plate line 33.

The example of FIG. 1 shows a configuration in which all of the memory cells MTr in the plurality of memory strings MS are connected commonly to one plate line 33. Instead, different plate lines may be provided for the respective memory strings MS, and the voltage control circuit 2 may control the voltages of the respective plate lines individually.

A second voltage terminal 34-$i$ is connected to the other end of the memory string MS. Each memory string MS is provided with one second voltage terminal 34-$i$. The second voltage terminal 34-$i$ is supplied with voltages necessary for various operations from the voltage control circuit 2, and connected also to an input terminal of the sense amplifier circuit 3.

[Set Operation (Write)]

Figure 3:
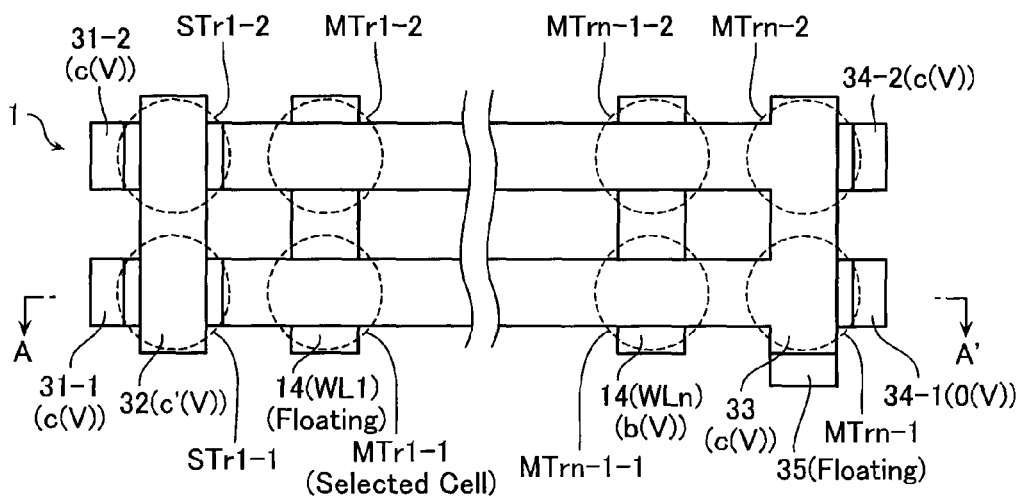
FIG. 3 is a conceptual diagram showing a set operation of the semiconductor memory device according to the first embodiment.

Next, a set operation of the semiconductor memory device according to the first embodiment will be explained with reference to FIG. 3. Here, the explanation will be given on an example in which the memory cell MTr1-1 in the first memory string MS is the target of the set operation (selected cell). The memory cells MTr other than the memory cell MTr1-1 are not the target of the set operation (unselected cells). For example, the memory cell MTr1-2 sharing the word line WL1 with the selected memory cell MTr1-1 is also an unselected cell.

First, an unillustrated transfer transistor of the word line WL (gate electrode 14) connected to the selected memory cell MTr1-1 is cut off to maintain this word line WL in a floating state. A voltage b (V) enough to make the memory cells conductive is applied to the remaining word lines WL (gate electrodes 14).

A voltage c(V) (c>b) is applied to the first voltage terminals 31-1 and 31-2. On the other hand, 0(V) is applied to the second voltage terminal 34-1 while the voltage c(V) is applied to the second voltage terminal 34-2. The third voltage terminal 35 is set to a floating state.

When a sufficient voltage c'(V) (c'>c) is applied to the select gate line 32, a channel is formed in a silicon region beneath the select gate line 32. Then, the select transistors STr1-1 and STr1-2 become conductive (ON), in response to this, the voltage c(V) is supplied to the plate line 33, thus causing capacitance coupling to raise the voltage of the word line WL of the selected memory cell MTr1-1 in the floating state. Hence, the selected memory cell MTr1-1 and the unselected memory cell MTr1-2 both switch to a conductive state. That is, in the memory cell MTr1-1, MTr1-2, a current can flow between the adjacent source/drain diffusion layers 12 through the conductive channel. Note that a potential difference c-b (V) is set to be smaller than both of the set voltage and the reset voltage to be applied to the variable resistance film 15.

However, as shown in FIG. 4, the source/drain diffusion layers 12 of the selected memory cell MTr1-1 is supplied with a voltage that is nearly 0(V) from the second voltage terminal 34-1. On the other hand, the source/drain diffusion layers 12 of the unselected memory cell MTr1-2 is supplied with c(V) from the second voltage terminal 34-2.

As shown at the left-hand side of FIG. 4, in the selected memory cell MTr1-1, the voltage of its channel region becomes approximately c/2 (V) due to an intrinsic potential difference across the pn junction. Therefore, in the selected memory cell MTr1-1, the potential difference between the gate electrode 14 and the plate line 33 becomes large, thereby applying a high voltage to the variable resistance film 15 sandwiched therebetween and executing the set operation.

In the unselected memory cell MTr1-2, on the other hand, as shown at the right-hand side of FIG. 4, the voltage of the channel region becomes substantially c(V). Therefore, in the unselected memory cell MTr1-2, the potential difference between the gate electrode 14 and the plate line 33 is substantially zero, and hence a set operation is not executed.

[Reset Operation (Erase)]

Next, a reset operation of the semiconductor memory device according to the first embodiment will be explained with reference to FIG. 5. Here, the explanation will also be given on an example in which the memory cell MTr1-1 in the first memory string MS is the target of the reset operation (selected cell). The memory cells MTr other than the memory cell MTr1-1 are not the target of the reset operation (unselected cells). For example, the memory cell MTr1-2 sharing the word line WL1 with the selected memory cell MTr1-1 is also an unselected cell.

First, 0(V) is supplied to the word line WL (gate electrode 14) connected to the selected memory cell MTr1-1. A positive voltage a(V) enough to make the memory cells conductive is applied to the remaining word lines WL (gate electrodes 14).

The voltage a (V) is applied to the first voltage terminal 31-1, and 0(V) is supplied to the first voltage terminal 31-2. The voltage a(V) is supplied to both of the second voltage terminals 34-1 and 34-2. The third voltage terminal 35 is set to a floating state.

When a sufficient voltage a'(V) (a'>a) is applied to the select gate line 32, a channel is formed in a silicon region beneath the select gate line 32. Then, the select transistors STr1-1 and STr1-2 become conductive (ON), in response to this, the voltage a(V) is supplied to the plate line 33, and is hence applied to between the word line 14 connected to the selected memory cell MTr1-1 and the plate line 33. Since the voltage a (V) is applied to both the first voltage terminal 31-1 and the second voltage terminal 34-1 of the selected memory cell MTr1-1, a large current flows into the word line 14 (WL1) from the plate line 33 through the variable resistance film 15. Hence, the reset operation is executed in the selected memory cell MTr1-1.

On the other hand, in the unselected memory cell MTr1-2, the voltage a (V) is applied to between the word line 14 and the plate line 33 likewise, but a large current flows not to the word line 14 (WL1) but to the first voltage terminal 31-2 because the first voltage terminal 31-2 is set to 0(V). Hence, a reset operation is not executed in the unselected memory cell MTr1-2.

[Read Operation (Read)]

Next, a read operation of the semiconductor memory device according to the first embodiment will be explained with reference to FIG. 6. Also here, the explanation will be given on an example in which the memory cell MTr1-1 in the first memory string MS is the target of the read operation (selected cell). The memory cells MTr other than the memory cell MTr1-1 are not the target of the read operation (unselected cell). For example, the memory cell MTr1-2 sharing the word line WL1 with the selected memory cell MTr1-1 is also an unselected cell.

First, the word line WL (gate electrode 14) connected to the selected memory cell MTr1-1 is set to a floating state. A positive voltage f(V) is applied to the remaining word lines WL (gate electrodes 14). In response to the application of the voltage f(V), the unselected memory cells in the memory strings MS become conductive regardless of the data retained therein. That is, in the unselected memory cells in the memory strings MS, a current can flow between the adjacent source/drain diffusion layers 12 through the conductive channel.

A voltage d(V) is applied to the first voltage terminals 31-1 and 31-2. Voltages 0(V) and d(V) are applied to the second voltage terminals 34-1 and 34-2, respectively. 0(V) is supplied to the select gate line 32 to make the select transistors STr1-1 and STr1-2 nonconductive (OFF). The voltage d(V) is supplied to the third voltage terminal 35 such that the voltage d(V) is applied to the plate line 33.

At this time, since the second voltage terminal 34-2 of the unselected memory string MS (memory cells MTr1-2 to MTrn-1-2) is set to d(V), no current flows through this memory string MS regardless of the data retained in the memory cell MTrn-1-2 (regardless of the state of the variable resistance film 15).

On the other hand, a current in the memory string MS that includes the selected memory cell MTr1-1 changes as follows in accordance with the state of the variable resistance film 15 of the selected memory cell MTr1-1.

If the variable resistance film 15 of the selected memory cell MTr1-1 is in a high resistance state, substantially no current flows through the current path that runs from the plate line 33 to the word line 14 through the variable resistance film 15. Therefore, the voltage of the word line 14 of the selected memory cell MTr1-1 does not rise enough, as a result, a current does not flow in the selected memory cell MTr1-1. Therefore, no current flows through the memory string MS including the selected memory cell MTr1-1.

Conversely, if the variable resistance film 15 of the selected memory cell MTr1-1 is in a low resistance state, a large current flows through the current path that runs from the plate line 33 to the word line 14 through the variable resistance film 15. Hence, the voltage of the word line 14 in the floating state rises to make the selected memory cell MTr1-1 conductive. That is, in the selected memory cell MTr1-1, a current can flow between the adjacent source/drain diffusion layers 12 through the conductive channel. Therefore, a current flows through the memory string MS including the selected memory cell MTr1-1.

By the sense amplifier circuit 3 sensing a potential change in the second voltage terminal 34-1 based on presence or absence of this current, it is possible to read out data retained in the selected memory cell MTr1-1.

[Second Embodiment]

Figure 7:
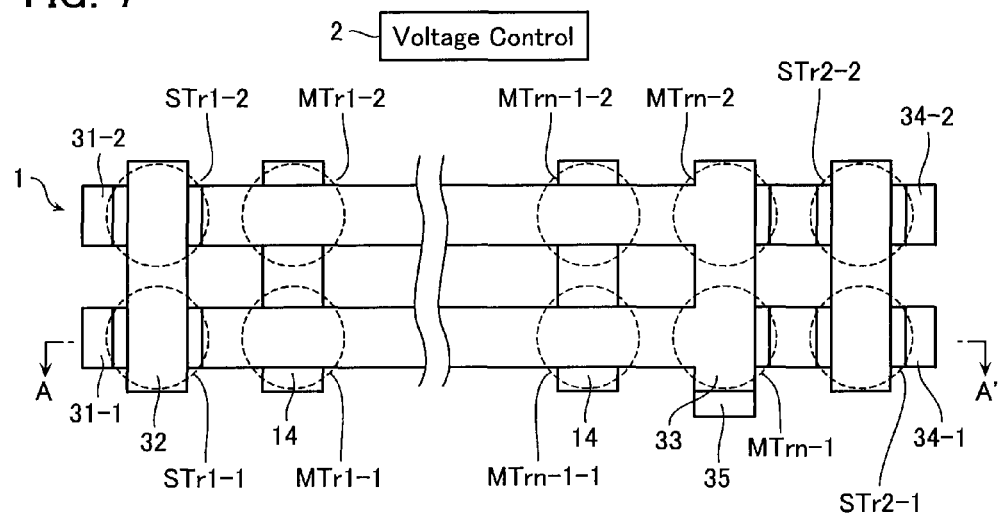
FIG. 7 is a plan diagram showing a configuration of a semiconductor memory device according to a second embodiment.
Figure 8:
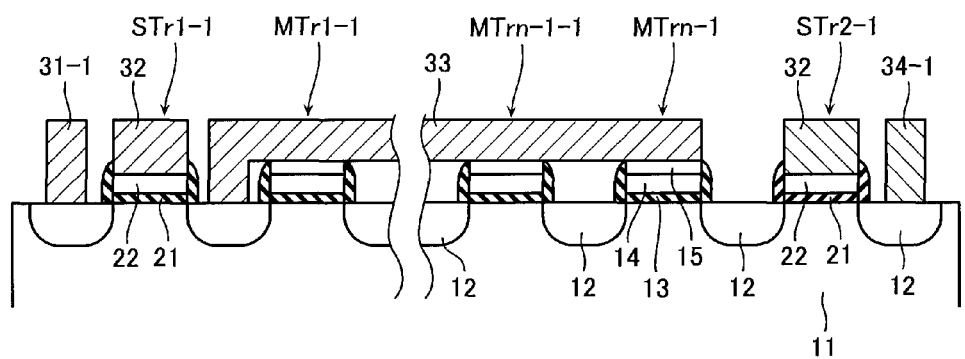
FIG. 8 is a sectional diagram of FIG. 7 taken along a line A-A'.

FIG. 7 is a plan diagram showing the configuration of a semiconductor memory device according to a second embodiment. FIG. 8 is a sectional diagram of FIG. 7 taken along a line A-A'. The semiconductor memory device according to the second embodiment is different from the first embodiment in that it includes select transistors STr2-1 and STr2-2 that are connected to the other end of the memory strings, in addition to the components of the device of the first embodiment. Set, reset, and read operations are substantially the same as the first embodiment. According to the present embodiment, in a set/reset operation in which the sense amplifier circuit 3 is not used, electrical connection between external circuits such as the sense amplifier circuit 3, etc. and the memory strings can be disconnected by using the select transistors STr2-1 and STr2-2. Therefore, it is possible to prevent any unexpected electric disturbance in the external circuits from influencing the memory strings. The second embodiment is preferable to the first embodiment in this point.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the above explanations, it was mentioned that the variable resistance film 15 is directly connected to the plate line 33 and the gate electrode 14, for the simplicity of the explanations. However, the electrical characteristics of the variable resistance film 15 is affected by a electrode contacted the variable resistance film 15. Therefore, a layer configured by a semiconductor or a metal (which is different from the plate line 33) may be disposed between the variable resistance film 15 and the plate line 33. Also, a layer configured by a semiconductor or a metal (which is different from the gate electrode 14) may be disposed between the variable resistance film 15 and the gate electrode 14.

What is claimed is:

1. A semiconductor memory device, comprising:
   a memory cell array including memory transistors each including a gate insulating film formed on a semiconductor substrate, a gate electrode formed on the gate insulating film, and a variable resistance film formed on the gate electrode and made of a variable resistance material having a variable resistance value, the memory cell array being configured by a plurality of memory strings each including plural ones of the memory transistors connected in series, the memory strings being disposed with their longer direction extending in a first direction;
   word lines disposed with their longer direction extending in a second direction orthogonal to the first direction, and each connected commonly to the gate electrodes of plural ones of the memory transistors lined up in the second direction;
   a plate line disposed to sandwich the variable resistance film between itself and the gate electrode;
   a plurality of first voltage terminals configured to supply a certain voltage to first ends of the plurality of memory strings, respectively; and
   a plurality of second voltage terminals configured to supply a certain voltage to second ends of the plurality of memory strings, respectively.

2. The semiconductor memory device according to claim 1, further comprising first select transistors connected between the first voltage terminals and the first ends, and becoming conductive when selecting the memory strings.

3. The semiconductor memory device according to claim 2, further comprising second select transistors connected between the second voltage terminals and the second ends and becoming conductive when selecting the memory strings.

4. The semiconductor memory device according to claim 2, wherein one end of the plate line is connected to the first select transistors.

5. The semiconductor memory device according to claim 1, further comprising a control circuit configured to control voltages to be supplied to the memory transistors,
   wherein when writing data into a memory transistor, the control circuit sets the word line connected to the memory transistor to be written to a floating state, while supplying the remaining word lines with a first voltage, and
   a potential difference between the first voltage and a second voltage supplied to the plate line is smaller than a voltage to be applied to the variable resistance film for changing the resistance value of the variable resistance film.

6. The semiconductor memory device according to claim 5, wherein when writing data into a memory transistor, the control circuit supplies voltages to the first voltage terminal and the second voltage terminal such that a certain potential difference is caused between a source and a drain of the memory transistor to be written, and supplies voltages to the first voltage terminals and the second voltage terminals such that a source and a drain of the memory transistors sharing the word line with the memory transistor to be written are provided with the same voltage.

7. The semiconductor memory device according to claim 1, further comprising a control circuit configured to control voltages to be supplied to the memory transistors,
   wherein when erasing data of a memory transistor, the control circuit supplies a ground voltage to the word line connected to the memory transistor to be erased, while supplying the remaining word lines with a first voltage, and
   a potential difference between the first voltage and a second voltage supplied to the plate line is smaller than a voltage to be applied to the variable resistance film for changing the resistance value of the variable resistance film.

8. The semiconductor memory device according to claim 7, wherein when erasing data of a memory transistor, the control circuit supplies voltages to the first voltage terminal and the second voltage terminal such that a source and a drain of the memory transistor to be erased are provided with the same voltage, and supplies voltages to the first voltage terminals and the second voltage terminals such that a certain potential difference is caused between a source and a drain of the memory transistors sharing the word line with the memory transistor to be erased.

9. The semiconductor memory device according to claim 1, further comprising a control circuit configured to control voltages to be supplied to the memory transistors,
   wherein when reading data of a memory transistor, the control circuit sets the word line connected to the memory transistor to be read to a floating state, while supplying the remaining word lines with a voltage that makes the memory transistors not to be read conductive.

10. The semiconductor memory device according to claim 9,
    wherein when reading data of a memory transistor, the control circuit supplies voltages to the first voltage terminal and the second voltage terminal such that a certain potential difference is caused between a source and a drain of the memory transistor to be read, and supplies voltages to the first voltage terminals and the second voltage terminals such that a source and a drain of the memory transistors sharing the word line with the memory transistor to be read are provided with the same voltage.

11. The semiconductor memory device according to claim 1, further comprising a third voltage terminal configured to supply a certain voltage to the plate line.

12. The semiconductor memory device according to claim 11, further comprising a control circuit configured to control voltages to be supplied to the memory transistors,
    wherein when writing data into a memory transistor, the control circuit sets the third voltage terminal to a floating state.

13. The semiconductor memory device according to claim 11, further comprising a control circuit configured to control voltages to be supplied to the memory transistors,
    wherein when erasing data of a memory transistor, the control circuit sets the third voltage terminal to a floating state.

14. The semiconductor memory device according to claim 11, further comprising a control circuit configured to control voltages to be supplied to the memory transistors,
    wherein when reading data of a memory transistor, the control circuit supplies the same voltage as a voltage supplied to the first voltage terminals to the third voltage terminal.

15. The semiconductor memory device according to claim 1,
    wherein the plate line is shared by the plurality of memory strings.

16. The semiconductor memory device according to claim 1,
    wherein the plate line is provided for each of the plurality of memory strings individually.

17. The semiconductor memory device according to claim 1,
    wherein the gate insulating film is made of a silicon oxide film, and
    the gate electrode is made of polysilicon doped with n-type impurity.

18. The semiconductor memory device according to claim 1,
    wherein the variable resistance film is made of carbon or a metal oxide film.

19. A writing method of a semiconductor memory device, the semiconductor memory device comprising:
    a memory cell array including memory transistors each including a gate insulating film formed on a semiconductor substrate, a gate electrode formed on the gate insulating film, and a variable resistance film formed on the gate electrode and made of a variable resistance material having a variable resistance value, the memory cell array being configured by a plurality of memory strings each including plural ones of the memory transistors connected in series, the memory strings being disposed with their longer direction extending in a first direction;
    word lines disposed with their longer direction extending in a second direction orthogonal to the first direction, and each connected commonly to the gate electrodes of plural ones of the memory transistors lined up in the second direction;
    a plate line disposed to sandwich the variable resistance film between itself and the gate electrode;
    a plurality of first voltage terminals configured to supply a certain voltage to first ends of the plurality of memory strings, respectively; and
    a plurality of second voltage terminals configured to supply a certain voltage to second ends of the plurality of memory strings, respectively,
    the method comprising setting the word line connected to a memory transistor to be written to a floating state, while supplying the remaining word lines with a first voltage,
    a potential difference between the first voltage and a second voltage supplied to the plate line being smaller than a voltage to be applied to the variable resistance film for changing the resistance value of the variable resistance film.

20. The writing method of the semiconductor memory device according to claim 19, comprising:
    supplying voltages to the first voltage terminal and the second voltage terminal such that a certain potential difference is caused between a source and a drain of a memory transistor to be written, and
    supplying voltages to the first voltage terminals and the second voltage terminals such that a source and a drain of the memory transistors sharing the word line with the memory transistor to be written are provided with the same voltage.

* * * * *